(12) United States Patent
Ding et al.

(10) Patent No.: US 9,472,632 B2
(45) Date of Patent: Oct. 18, 2016

(54) SEMICONDUCTOR DEVICE

(71) Applicant: Semiconductor Manufacturing International (Shanghai) Corporation, Shanghai (CN)

(72) Inventors: Shicheng Ding, Shanghai (CN); Fenghua Fu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/695,552

(22) Filed: Apr. 24, 2015

(65) Prior Publication Data
US 2015/0311203 A1    Oct. 29, 2015

(30) Foreign Application Priority Data

Apr. 24, 2014  (CN) ................. 2014 1 0167025

(51) Int. Cl.
| | |
|---|---|
| *H01L 31/0312* | (2006.01) |
| *H01L 29/417* | (2006.01) |
| *H01L 29/78* | (2006.01) |
| *H01L 27/02* | (2006.01) |
| *H01L 27/092* | (2006.01) |
| *H01L 21/8238* | (2006.01) |
| *H01L 29/165* | (2006.01) |

(52) U.S. Cl.
CPC ..... *H01L 29/41783* (2013.01); *H01L 27/0207* (2013.01); *H01L 27/092* (2013.01); *H01L 29/7848* (2013.01); *H01L 21/823807* (2013.01); *H01L 21/823814* (2013.01); *H01L 29/165* (2013.01)

(58) Field of Classification Search
CPC  H01L 31/0312; H01L 29/45; H01L 29/7802
USPC ................................................ 257/77
See application file for complete search history.

(56) References Cited

U.S. PATENT DOCUMENTS

| | | | |
|---|---|---|---|
| 2008/0042123 A1* | 2/2008 | Thei | H01L 21/823807 257/19 |
| 2008/0169484 A1* | 7/2008 | Chuang | H01L 29/7843 257/190 |
| 2014/0284723 A1* | 9/2014 | Lee | H01L 21/823821 257/369 |

* cited by examiner

*Primary Examiner* — Phuc Dang
(74) *Attorney, Agent, or Firm* — Innovation Counsel LLP

(57) ABSTRACT

A semiconductor device is provided. The semiconductor device includes a semiconductor substrate, and a core device and a dummy device disposed on the semiconductor substrate. The core device includes a first gate disposed on the semiconductor substrate and a first stress layer disposed on opposing sides of the first gate. The dummy device includes a second gate disposed on the semiconductor substrate and a second stress layer disposed on opposing sides of the second gate.

21 Claims, 3 Drawing Sheets

US 9,472,632 B2

SEMICONDUCTOR DEVICE

CROSS-REFERENCE TO RELATED APPLICATION

This application claims priority to Chinese Patent Application No. 201410167025.0 filed on Apr. 24, 2014, the disclosure of which is incorporated herein by reference in its entirety.

BACKGROUND

1. Technical Field The present disclosure relates to the field of semiconductor technology, and more particularly to a semiconductor device including a dummy device.

2. Description of the Related Art

In the field of semiconductor technology, a dummy device is often fabricated on a semiconductor device during the manufacturing process, so as to ensure uniform device density and to prevent pattern mismatch between devices.

In the past decade, embedded silicon germanium (e-SiGe) technology has been widely used to increase the mobility of p-type metal-oxide-semiconductor (PMOS) devices. As the technology process node scales from 28 nm to 22 nm and below, embedded silicon carbide (e-SiC) technology is more widely used in n-type metal-oxide-semiconductor (NMOS) with high-k metal gates.

The design and distribution of the dummy patterns on a stress layer is especially important when the technology process node is 22 nm and below. For example, improper design of the dummy patterns could result in overlay defects during subsequent processing, incompatibility with other semiconductor processes, and unreliable circuit simulation models (e.g. using Simulation Program with Integrated Circuit Emphasis (SPICE) models).

In some instances, the shape and layout between the dummy device and the transistors on the stress layer may differ significantly. As a result, during the manufacture of the semiconductor device, overlay defects and other problems may occur during subsequent processing, thereby impacting the yield and reliability of the semiconductor device.

SUMMARY

The present disclosure addresses at least the above issues in the prior art.

According to an embodiment of the inventive concept, a semiconductor device is provided. The semiconductor device includes a semiconductor substrate, and a core device and a dummy device disposed on the semiconductor substrate. The core device includes a first gate disposed on the semiconductor substrate and a first stress layer disposed on opposing sides of the first gate, and the dummy device includes a second gate disposed on the semiconductor substrate and a second stress layer disposed on opposing sides of the second gate.

In one embodiment, the core device and the dummy device may have a same shape.

In one embodiment, the first stress layer and the second stress layer may be formed of a same material.

In one embodiment, each of the core device and the dummy device may include an n-type metal-oxide-semiconductor (NMOS), and each of the first stress layer and the second stress layer may include an embedded silicon carbide layer.

In one embodiment, each of the core device and the dummy device may include a p-type metal-oxide-semiconductor (PMOS), and each of the first stress layer and the second stress layer may include an embedded silicon germanium layer.

In one embodiment, each of the core device and the dummy device may include an n-type metal-oxide-semiconductor (NMOS) and a p-type metal-oxide-semiconductor (PMOS), each of the first stress layer in the NMOS of the core device and the second stress layer in the NMOS of the dummy device may include an embedded silicon carbide layer, and each of the first stress layer in the PMOS of the core device and the second stress layer in the PMOS of the dummy device may include an embedded silicon germanium layer.

In one embodiment, the second stress layer may form a raised source-drain-gate structure.

In one embodiment, the first gate may be a metal gate.

In one embodiment, the second gate may be a metal gate.

In one embodiment, the dummy device may include a pair of dummy devices.

In one embodiment, the pair of dummy devices may include an n-type metal-oxide-semiconductor (NMOS) and a p-type metal-oxide-semiconductor (PMOS).

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
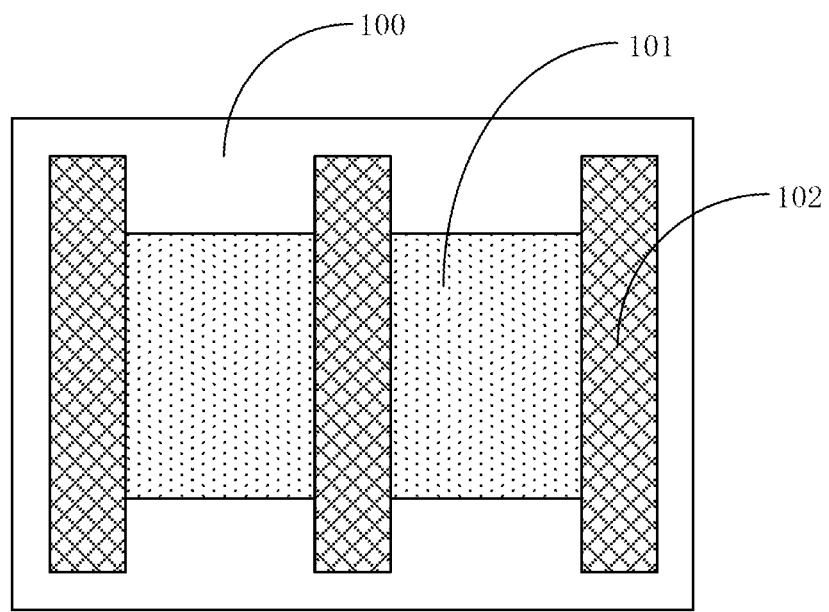
FIG. 1 is a schematic diagram showing the structure of a dummy device in a semiconductor device.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

A semiconductor device according to an embodiment includes a core device and a dummy device disposed on a semiconductor substrate. The core device provides the key functions of the semiconductor device. The dummy device typically does not provide any electrical function, and is formed on the semiconductor substrate at the same time as the core device. The dummy device helps to improve device density uniformity on the semiconductor substrate. In particular, the dummy device can reduce pattern mismatch between adjacent core devices. The semiconductor device may include Electrically Erasable Programmable Read-Only Memory (EEPROM) or other types of semiconductor devices.

FIG. 1 illustrates the structure of a dummy device. As shown in FIG. 1, the dummy device includes source regions 101 on a semiconductor substrate 100, and gates 102 disposed on the source regions 101. Transistors on a stress layer (not shown) may include PMOS (comprising a silicon-germanium layer) and NMOS (comprising a silicon-carbide layer).

Next, the structure of an exemplary semiconductor device will be described with reference to FIG. 2. Specifically, FIG. 2 is a schematic diagram showing the structure of the dummy device and the core device in the semiconductor device according to an embodiment.

Figure 2:
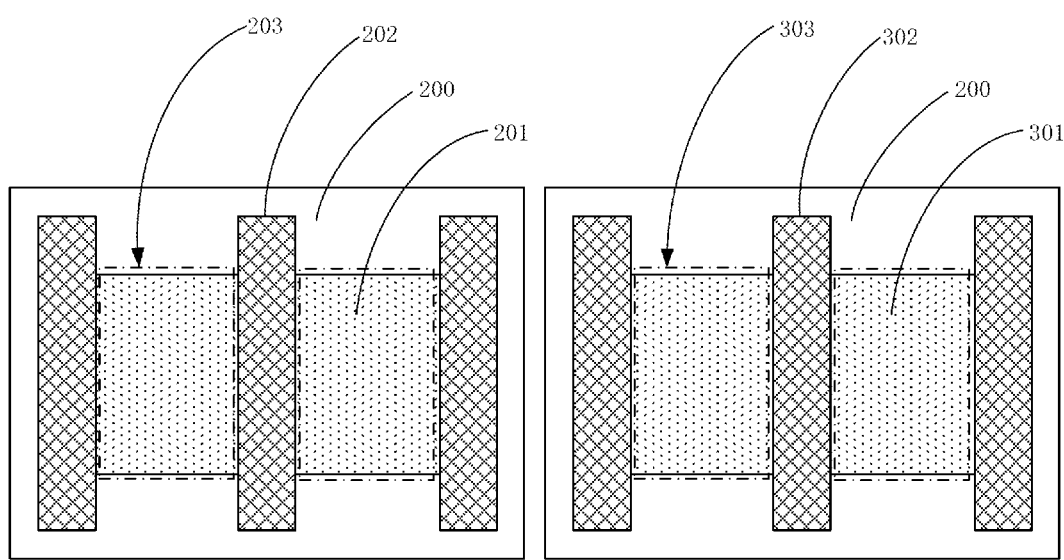
FIG. 2 is a schematic diagram showing the structure of a dummy device and a core device in a semiconductor device according an embodiment.

In the embodiment of FIG. 2, the semiconductor device includes a dummy device and a core device disposed on a semiconductor substrate 200. Each of the dummy device and the core device includes a gate disposed on the semiconductor substrate and a stress layer disposed on opposing sides of the gate. In one embodiment, when the core device is a PMOS, the stress layer may be an embedded silicon germanium layer. In another embodiment, when the core device is an NMOS, the stress layer may be an embedded silicon carbide layer.

Referring to FIG. 2, the dummy device includes active regions 201 and gates 202 disposed on the semiconductor substrate 200. The dummy device further includes a stress layer 203 disposed on the semiconductor substrate 200 on opposing sides of a gate 202. The stress layer 203 is indicated by dashed lines in FIG. 2.

Similarly, the core device includes active regions 301 and gates 302 disposed on the semiconductor substrate 200. The dummy device further includes a stress layer 303 disposed on the semiconductor substrate 200 on opposing sides of a gate 302. The stress layer 303 is indicated by dashed lines in FIG. 2.

The stress layer 203 in the dummy device may be formed of the same material as the stress layer 303 in the core device. For example, the stress layers 203 and 303 may be an embedded silicon germanium layer (corresponding to the PMOS) or an embedded silicon carbide layer (corresponding to the NMOS). The stress layer 203 in the dummy device may be formed at the same time when forming the stress layer 303 in the core device. In other words, the stress layer 203 in the dummy device may be formed at the same time when forming the embedded silicon germanium layer or the embedded silicon carbide layer in the core device.

The stress layer 203 in the dummy device may be formed having the same shape as the stress layer 303 in the core device. In other words, the stress layer 203 in the dummy device may be formed having the same shape as the embedded silicon germanium layer or embedded silicon carbide layer in the core device. Specifically, when the dummy device is an NMOS, the stress layer 203 is fabricated in accordance with the NMOS of the core device (i.e. the stress layer 203 is formed of the same material as the stress layer 303, and the stress layers 203/303 are an embedded silicon carbide layer). Likewise, when the dummy device is a PMOS, the stress layer 203 is fabricated in accordance with the PMOS of the core device (i.e. the stress layer 203 is formed of the same material as the stress layer 303, and the stress layers 203/303 are an embedded silicon germanium layer).

Figure 3:
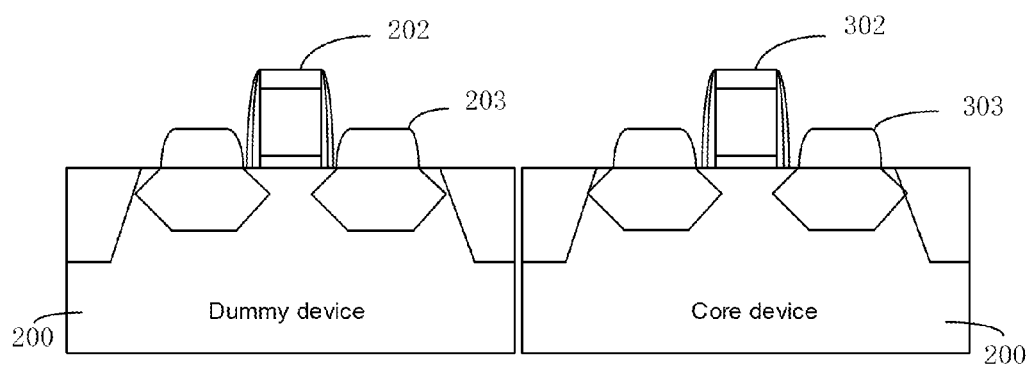
FIG. 3 is a schematic cross-sectional view illustrating a raised source-drain-gate structure of the dummy device and the core device according an embodiment.

In one embodiment, the stress layer 203 of the dummy device is the same as the stress layer 303 in the core device, such that both the stress layers 203 and 303 have a raised source-drain-gate structure, for example, as illustrated in FIG. 3. Accordingly, in the above embodiment, the NMOS and PMOS transistors of the dummy device are formed having a raised source-drain-gate structure.

As previously described, the stress layer 203 is disposed on opposing sides of a gate 202. Thus, the stress layer 203 in the dummy device is provided in a pair (since there are two opposing sides of the gate 202). Nevertheless, the inventive concept is not limited thereto, and the stress layer 203 may be disposed in other configurations. For example, in an alternative embodiment, the stress layer 203 may be disposed on only one side of the gate 202.

In one embodiment, the dummy device and the core device have the same structure. For example, the NMOS in the dummy device and the NMOS in the core device may have the same structure. Likewise, the PMOS in the dummy device and the PMOS in the core device may have the same structure.

In one embodiment, the dummy device may be provided in pairs, and includes an NMOS and a PMOS.

In one embodiment, the semiconductor device may be fabricated using high-k metal gate technology. Accordingly, the gate of the core device may be a metal gate, and the gate of the dummy device may also be a metal gate.

Since the dummy device and the core device have the same shape and layout, the device density on the semiconductor substrate will therefore be uniform. The uniformity in device density helps to reduce defects during subsequent processing.

Also, since the stress layers on the dummy device and the core device are the same, less overlap defects will be introduced during subsequent processing. The formation of the stress layers is also compatible with other semiconductor processes (e.g. back-end processes). In addition, the performance of the semiconductor device can be predicted reliably using circuit simulation models (e.g. SPICE models). In particular, when the stress layer is disposed uniformly on opposing sides of the gate in the dummy device, the semiconductor device will have reduced overlap defects.

In the semiconductor device, both the dummy device and the core device include stress layers disposed uniformly on opposing sides of the gates. During subsequent processing, additional films can be accurately deposited on (and overlapping with) the stress layers. Accordingly, the yield and reliability of the semiconductor device can be improved.

It is noted that the structure of the semiconductor device is well-suited for devices fabricated at 22 nm technology process node and below.

The semiconductor device of FIG. 2 may be incorporated into an electronic apparatus. As previously mentioned, the exemplary semiconductor device has improved yield and reliability compared to existing devices. Therefore, the electronic apparatus including the exemplary semiconductor device would inherit the above desirable characteristics. The exemplary semiconductor device can be formed on an integrated circuit that is then incorporated into the electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices.

Embodiments of a semiconductor device and a method of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A semiconductor device comprising:
a semiconductor substrate; and
a core device and a dummy device disposed on the semiconductor substrate,
wherein the core device includes a first gate disposed on the semiconductor substrate and a first stress layer disposed on opposing sides of the first gate, and
the dummy device includes a second gate disposed on the semiconductor substrate and a second stress layer disposed on opposing sides of the second gate,
wherein the first stress layer and the second stress layer are formed of a same material,
wherein each of the core device and the dummy device includes an n-type metal-oxide-semiconductor (NMOS), and
wherein each of the first stress layer and the second stress layer includes an embedded silicon carbide layer.

2. The semiconductor device according to claim 1, wherein the core device and the dummy device have a same shape.

3. The semiconductor device according to claim 1, wherein the second stress layer forms a raised source-drain-gate structure.

4. The semiconductor device according to claim 1, wherein the first gate is a metal gate.

5. The semiconductor device according to claim 1, wherein the second gate is a metal gate.

6. The semiconductor device according to claim 1, wherein the dummy device comprises a pair of dummy devices.

7. The semiconductor device according to claim 6, wherein the pair of dummy devices includes an n-type metal-oxide-semiconductor (NMOS) and a p-type metal-oxide-semiconductor (PMOS).

8. A semiconductor device comprising:
a semiconductor substrate; and
a core device and a dummy device disposed on the semiconductor substrate,
wherein the core device includes a first gate disposed on the semiconductor substrate and a first stress layer disposed on opposing sides of the first gate, and
the dummy device includes a second gate disposed on the semiconductor substrate and a second stress layer disposed on opposing sides of the second gate, wherein the first stress layer and the second stress layer are formed of a same material,
wherein each of the core device and the dummy device includes a p-type metal-oxide-semiconductor (PMOS), and
each of the first stress layer and the second stress layer includes an embedded silicon germanium layer.

9. The semiconductor device according to claim 8, wherein the core device and the dummy device have a same shape.

10. The semiconductor device according to claim 8, wherein the second stress layer forms a raised source-drain-gate structure.

11. The semiconductor device according to claim 8, wherein the first gate is a metal gate.

12. The semiconductor device according to claim 8, wherein the second gate is a metal gate.

13. The semiconductor device according to claim 8, wherein the dummy device comprises a pair of dummy devices.

14. The semiconductor device according to claim 13, wherein the pair of dummy devices includes an n-type metal-oxide-semiconductor (NMOS) and a p-type metal-oxide-semiconductor (PMOS).

15. A semiconductor device comprising:
a semiconductor substrate; and
a core device and a dummy device disposed on the semiconductor substrate,
wherein the core device includes a first gate disposed on the semiconductor substrate and a first stress layer disposed on opposing sides of the first gate, and
the dummy device includes a second gate disposed on the semiconductor substrate and a second stress layer disposed on opposing sides of the second gate,
wherein the first stress layer and the second stress layer are formed of a same material,
wherein each of the core device and the dummy device includes an n-type metal-oxide-semiconductor (NMOS) and a p-type metal-oxide-semiconductor (PMOS),
wherein each of the first stress layer in the NMOS of the core device and the second stress layer in the NMOS of the dummy device includes an embedded silicon carbide layer, and
wherein each of the first stress layer in the PMOS of the core device and the second stress layer in the PMOS of the dummy device includes an embedded silicon germanium layer.

16. The semiconductor device according to claim 15, wherein the core device and the dummy device have a same shape.

17. The semiconductor device according to claim 15, wherein the second stress layer forms a raised source-drain-gate structure.

18. The semiconductor device according to claim 15, wherein the first gate is a metal gate.

19. The semiconductor device according to claim 15, wherein the second gate is a metal gate.

20. The semiconductor device according to claim 15, wherein the dummy device comprises a pair of dummy devices.

21. The semiconductor device according to claim 20, wherein the pair of dummy devices includes an n-type metal-oxide-semiconductor (NMOS) and a p-type metal-oxide-semiconductor (PMOS).

\* \* \* \* \*